(12) United States Patent
Al et al.

(10) Patent No.: US 11,879,949 B2
(45) Date of Patent: Jan. 23, 2024

(54) GROUND FAULT MONITORING SYSTEM FOR AN ENERGY STORAGE SYSTEM

(71) Applicant: Volvo Car Corporation, Gothenburg (SE)

(72) Inventors: Fatih Al, Gothenburg (SE); Hicham Sadoun, Gothenburg (SE); Ustun Saglam, Gothenburg (SE); Anders Lasson, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 0 days.

(21) Appl. No.: 17/878,169

(22) Filed: Aug. 1, 2022

(65) Prior Publication Data

US 2023/0068600 A1 Mar. 2, 2023

(30) Foreign Application Priority Data

Aug. 24, 2021 (EP) ..................................... 21192829

(51) Int. Cl.

| | |
|---|---|
| *G01R 31/00* | (2006.01) |
| *G01R 31/52* | (2020.01) |
| *B60L 3/00* | (2019.01) |
| *G01R 19/10* | (2006.01) |
| *G01R 19/165* | (2006.01) |
| *H02J 7/00* | (2006.01) |

(52) U.S. Cl.
CPC ............ *G01R 31/52* (2020.01); *B60L 3/0046* (2013.01); *G01R 19/10* (2013.01); *G01R 19/16576* (2013.01); *H02J 7/0047* (2013.01); *H02J 7/0063* (2013.01); *H02J 2207/20* (2020.01)

(58) Field of Classification Search
USPC ......................................................... 324/509
See application file for complete search history.

(56) References Cited

U.S. PATENT DOCUMENTS

| | | |
|---|---|---|
| 2014/0084935 A1 | 3/2014 | Chatroux et al. |
| 2019/0146040 A1 | 5/2019 | Murakami et al. |
| 2020/0200833 A1 | 6/2020 | Mayer et al. |

OTHER PUBLICATIONS

Jan. 19, 2022 European Search Report issued in Corresponding International Application No. 21192829.

*Primary Examiner* — Vincent Q Nguyen
(74) *Attorney, Agent, or Firm* — Clements Bernard Walker; Christopher L. Bernard

(57) ABSTRACT

A ground fault monitoring system includes an isolation monitoring unit, a first main switch, a second main switch and a control unit. The isolation monitoring unit is arrangeable between an energy storage system and a ground element. The switches are arrangeable between the energy storage system and an external energy supply system. The isolation monitoring unit includes a first, second and third switchable resistor branches. The control unit is configured to close the switches during charging of the energy storage system for connecting the energy storage system to the external energy supply system and to disconnect the first switchable resistor branch from the energy storage system and connect the second switchable resistor branch and the third switchable resistor branch to the energy storage system for monitoring a current leakage to the ground element during charging of the energy storage system.

15 Claims, 3 Drawing Sheets

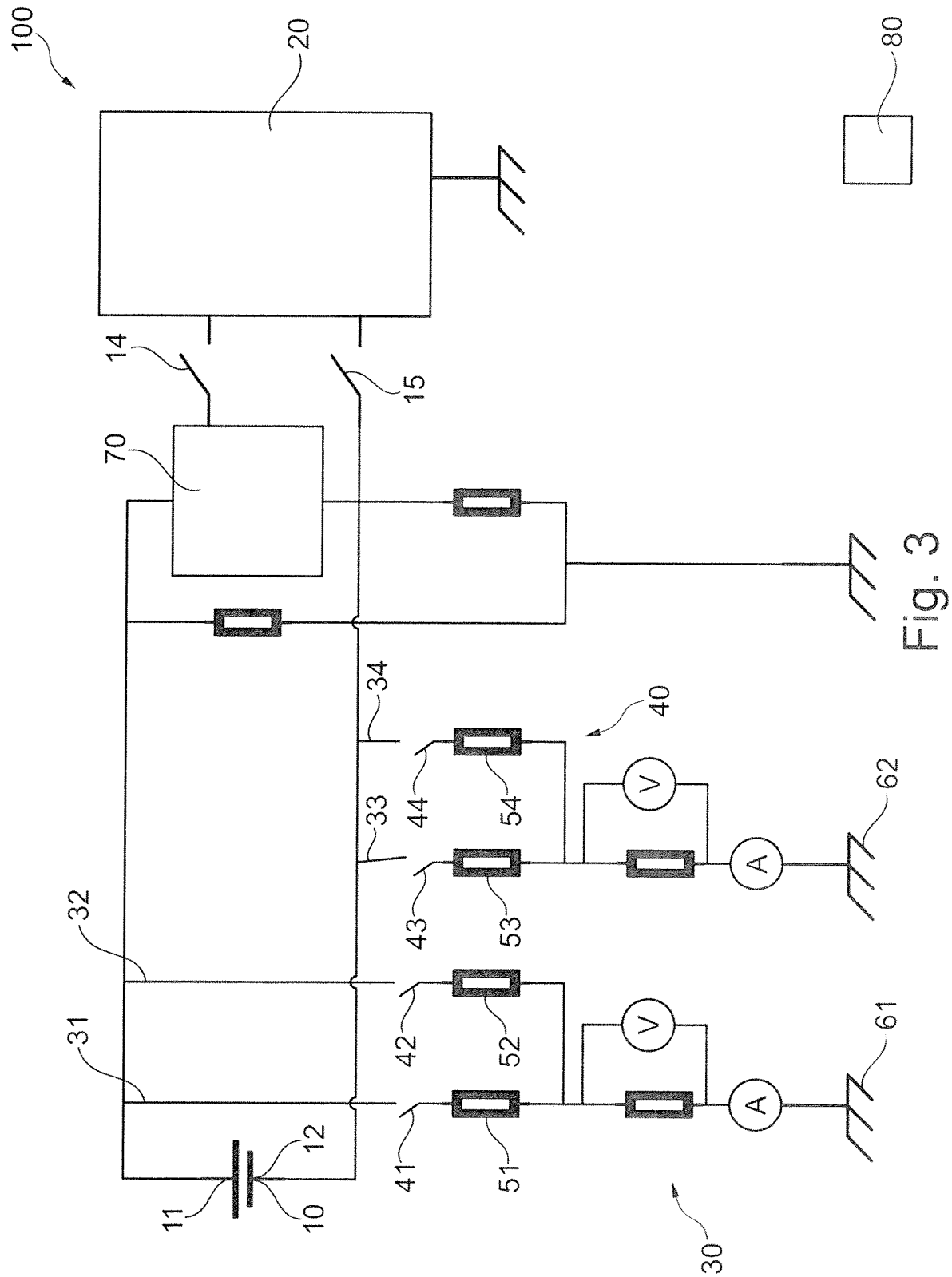

GROUND FAULT MONITORING SYSTEM FOR AN ENERGY STORAGE SYSTEM

CROSS-REFERENCE TO RELATED APPLICATION

The present disclosure claims the benefit of priority of European Patent Application No. 21 192 829.6, filed on Aug. 24, 2021, and entitled "GROUND FAULT MONITORING SYSTEM FOR AN ENERGY STORAGE SYSTEM," the contents of which are incorporated in full by reference herein.

TECHNICAL FIELD

The present disclosure relates to a ground fault monitoring system for an energy storage system, an energy storage system including such a ground fault monitoring system, a vehicle including such an energy storage system, a method for ground fault monitoring for an energy storage system and a computer program element for such a ground fault monitoring system.

BACKGROUND

An electric vehicle such as battery electric vehicle or hybrid electric vehicle may be powered by a high voltage energy storage system. In such electric vehicles, various high-voltage electric systems are connected to the high voltage energy storage system, but isolated from a vehicle chassis. It is known in the art to provide an isolation monitoring devices (IMD) that monitors the isolation resistance so that the control system can de-energize the electric system to avoid risk for electric shock.

An energy storage system having a rated voltage of 800V can provide a higher power density than an energy storage system having a rated voltage of 400V at the same size, when being supplied with the same electric current. At present, most of the existing charging stations are equipped with 400V fast-chargers, capable of up to 500V.

During charging the 800V energy storage system via the 400V charging station, an isolation monitoring device of the charging station might not detect an isolation failure in the 800V electric systems. Generally, in case of the isolation failure in the 800V system before starting charging, vehicle may prohibit charging. However, when no isolation resistance fault is detected, charging may start with a symmetrization function. Since the vehicle turns off its own IMD during charging to avoid interference with the IMD of the charging station, there is always a risk with a non-monitored isolation failure in the 800V system.

SUMMARY

Hence, there may be a need to provide an improved ground fault monitoring system, which may reliably monitor an isolation resistance of a high voltage system during operating and charging in spite of a voltage difference between the energy storage system and a charging station.

The problem is solved by the subject matter of the present disclosure. It should be noted that the aspects of the disclosure described in the following apply to the ground fault monitoring system for an energy storage system, the energy storage system including such a ground fault monitoring system, the vehicle including such an energy storage system, the method for ground fault monitoring for an energy storage system and the computer program element for such a ground fault monitoring system.

According to the present disclosure, a ground fault monitoring system for an energy storage system is presented. The ground fault monitoring system includes an isolation monitoring unit, a first main switch, a second main switch and a control unit. The isolation monitoring unit is arrangeable between the energy storage system and a ground element. The first main switch and the second main switch are arrangeable between the energy storage system and an external energy supply system. The isolation monitoring unit includes a first switchable resistor branch, a second switchable resistor branch and a third switchable resistor branch. The control unit is configured to close the first main switch and the second main switch during charging of the energy storage system for connecting the energy storage system to the external energy supply system. The control unit is further configured to disconnect the first switchable resistor branch from the energy storage system and connect the second switchable resistor branch and the third switchable resistor branch to the energy storage system for monitoring a current leakage to the ground element during charging of the energy storage system.

The ground fault monitoring system according to the present disclosure can act as a hybrid monitoring system, which monitors a current leakage during charging of the energy storage system and an isolation monitoring during discharging and/or supplying energy from the energy storage system. The ground fault monitoring system may not induce interference with an isolation monitoring device of the external energy supply system such as a charging station during charging. Additionally, the ground fault monitoring system can quickly react against an isolation failure and prevent an overvoltage in the charging station. Further, a controlled isolation resistance during charging can be realized and balancing a pole to ground voltage of in the external energy supply system can be facilitated.

The energy storage system may be a high voltage energy storage system, which provides several hundreds of volts as an energy source for operating a machine. The energy storage system may include a plurality of rechargeable energy storage modules and/or energy storage cells such as lithium-ion cells, nickel metal hydride cells or the like. For a safe use, a high voltage system having such energy storage system may be required to be reliably isolated.

Isolation monitoring of the energy storage system may be achieved by measuring the isolation resistance, which may not decrease below a predefined threshold. The monitoring unit may include several switchable resistor branches to facilitate monitoring the isolation resistance between the energy storage system and the ground element, for instance a car body or an electric chassis in case of a car. The isolation monitoring unit may be electrically connected to a positive terminal unit and a negative terminal unit of the energy storage system.

The first switchable resistor branch, the second switchable resistor branch and the third switchable resistor branch may be connected to a same ground element or different ground elements. Further, all ground elements may be galvanically connected to each other. The first switchable resistor branch and the second switchable resistor branch may be coupled with the energy storage at a same pole side, wherein the second switchable resistor branch may include a bigger isolation resistance capability than the first switchable resistor branch. Alternatively, second switchable resistor branch may include the same or smaller isolation resistance capability as the first switchable resistor branch. The third switchable resistor branch may be coupled with the energy storage at the different pole side than the first and second switchable resistor branches. In other words, the first switchable resistor branch and the second switchable resistor branch may be coupled with the energy storage at a positive pole side and the third switchable resistor branch may be coupled with the energy storage at a negative pole side and vice versa.

The control unit may be a battery management system (BMS) or it may at least communicate with the BMS. The control unit may be configured to monitor and control the isolation of the high voltage system. The control unit may measure the isolation resistance by applying the isolation monitoring unit. The control unit may be further configured to monitor and control the energy storage system, assure health of battery cells, and deliver energy to subsystems. For initiating charging the energy storage system, the control unit may close the first main switch and the second main switch for connecting the energy storage system to the external energy supply system.

The external energy supply system may be any charging station or an electric grid, which may have less voltage capacity than the energy storage system. However, the external energy supply system may also have the same or bigger voltage capacity than the energy storage system.

Further, the control unit may activate the second switchable resistor branch and the third switchable resistor branch and deactivate the first switchable resistor branch during charging of the energy storage system for monitoring the current leakage to the ground element. The current leakage may be detected by monitoring a resistance ratio of the second switchable resistor branch and the third switchable resistor branch. In particular, the current leakage may be detected by monitoring a ratio of parasitic isolation resistances, which is measurable e.g., by Amperemeters.

In an embodiment, during supplying energy from the energy storage system, the control unit is configured to open the first main switch and the second main switch and to alternately connect and disconnect the first switchable resistor branch and the third switchable resistor branch. When the energy storage system operates to supply electric energy to subsystems connected thereto, the first main switch and the second main switch may be open to disconnect the energy storage system from the external energy supply system.

Further, the control unit activate and deactivate the first switchable resistor branch and the third switchable resistor branch alternately and periodically to estimate the isolation resistance of the high voltage system or between the energy storage system and the ground element. In other words, the control unit may connect only the first switchable resistor branch and disconnect the third switchable resistor branch from the energy storage system and measure a voltage and/or a current of the first switchable resistor branch. Afterwards, the control unit may connect only the third switchable resistor branch and disconnect the first switchable resistor branch from the energy storage system and measure a voltage and/or a current of the third switchable resistor branch. Such switching of the first switchable resistor branch and the third switchable resistor branch may be performed continuously and periodically during operating the energy storage system. Accordingly, the isolation monitoring of the energy storage system during supplying and/or discharging energy from the energy storage system may be performed.

In an embodiment, the first switchable resistor branch includes a first isolation switch element and a first isolation resistor element and encircles the first isolation switch element, the first isolation resistor element, a positive terminal of the energy storage system and the ground element during supplying energy from the energy storage system.

The first isolation switch element may allow the positive terminal of the energy storage system to be connected to the ground element via the first isolation resistor element during discharging and/or supplying energy from the energy storage system. Accordingly, if the first isolation switch element is closed, the first switchable resistor branch may be activated or connected to measure the isolation resistance between the energy storage system and the ground element during operating the energy storage system. The first isolation resistor element may include, for instance, an isolation resistance of 1 MΩ.

In an embodiment, the second switchable resistor branch includes a second isolation switch element and a second isolation resistor element and encircles the second isolation switch element, the second isolation resistor element, the positive terminal of the energy storage system and the ground element during charging of the energy storage system.

The second isolation switch element may allow the positive terminal of the energy storage system to be connected to the ground element via the second isolation resistor element during charging of the energy storage system. In other words, during discharging energy from the energy storage system, the first isolation switch element may be opened. Accordingly, if the second isolation switch element is closed, the second switchable resistor branch may be activated or connected to measure the current leakage of the energy storage system during charging of the energy storage system. The second isolation resistor element may include, for instance, an isolation resistance of 2 MΩ.

In an embodiment, the third switchable resistor branch includes a third isolation switch element and a third isolation resistor element and encircles the third isolation switch element, the third isolation resistor element, a negative terminal of the energy storage system and the ground element.

The third isolation switch element may allow the negative terminal of the energy storage system to be connected to the ground element via the third isolation resistor element during supplying energy from the energy storage system and/or charging the energy storage system. Accordingly, if the third isolation switch element is closed, the third switchable resistor branch may be activated or connected to measure a current leakage of the energy storage system and/or an isolation resistance between the energy storage system and the ground element during supplying energy from the energy storage system and/or charging the energy storage system, respectively. The third isolation resistor element may include, for instance, an isolation resistance of 1 MΩ.

In an embodiment, the first isolation switch element and the third isolation switch element may be alternately opened and closed during discharging and/or supplying energy from the energy storage system. Additionally, the first main switch and the second main switch may be open to disconnect the energy storage system from the external energy supply system. Such switching of the first isolation switch element and the third isolation switch element may be performed continuously and periodically during supplying energy from the energy storage system to the subsystems to perform the isolation monitoring.

In an embodiment, the ground fault monitoring system further includes a symmetrization circuit configured for a symmetrization of the positive terminal and the negative terminal of the energy storage system with respect to a chassis ground, wherein the symmetrization circuit is integrated in the isolation monitoring unit. The isolation monitoring unit further includes a fourth switchable resistor branch. The symmetrization circuit may be configured to improve the ground fault monitoring for high-resistance ground faults by equalizing an unbalance of phase-to-ground voltage levels.

The fourth switchable resistor branch may include a fourth isolation switch element and a fourth isolation resistor element. The fourth switchable resistor branch may encircle the fourth isolation switch element, the fourth isolation resistor element, the negative terminal of the energy storage system and the ground element.

During discharging energy from the energy storage system, i.e. if the first main switch and the second main switch are opened, the first isolation switch element and the third isolation switch element may be alternately closed to perform the isolation monitoring. Meanwhile, the second isolation switch element and the fourth isolation switch element may be opened.

During charging of the energy storage system, the second isolation switch element and the fourth isolation switch element may be continuously closed to realize an ideal symmetrical system. Meanwhile, the first isolation switch element and the third isolation switch element may be controlled to form the symmetrization circuit, e.g. controlled by pwm duty ratio to create a required resistance. The symmetrization circuit may try to maintain a pole to ground voltage symmetry in the high voltage system, if any asymmetry occurs due to a low isolation resistance. The control unit may continuously monitor the current and/or the voltage of the isolation monitoring unit and/or the ground fault monitoring system. In case the control unit is not able to control the asymmetry due to an isolation failure and/or leakage current, the control unit may stop charging the energy storage system by opening the first main switch and the second main switch.

In an embodiment, the ground element includes a first ground member and a second ground member, wherein the first switchable resistor branch and the second switchable resistor branch are connected to the first ground member and the third switchable resistor branch and the fourth switchable resistor branch are connected to the second ground member. Accordingly, a separate isolation monitoring between the ground element and the positive terminal of the energy storage system and between the ground element and the negative terminal of the energy storage system may be achieved.

For instance, when an isolation resistance between a DC+ and an electric chassis is low compared to an isolation resistance between a DC− and the electric chassis, a voltage between DC− and chassis may be increased. Hence, the ground fault monitoring system can react earlier to prevent overload of the charger's withstand voltage, and particularly to prevent excessive voltage between any pole to chassis ground for external power supply.

Preferably, two switchable resistor branches, which may be connected to the same pole side of the energy storage system, may be coupled with the same ground member. Hence, the first switchable resistor branch and/or the second switchable resistor branch, which may be connected to the positive terminal of the energy storage system, may be coupled with the first ground member and the third switchable resistor branch and/or the fourth switchable resistor branch, which may be connected to the negative terminal of the energy storage system, may be coupled with the second ground member. Further, all ground members may be galvanically connected to each other.

In an embodiment, the control unit is configured to measure a voltage and/or a current in the first switchable resistor branch and the third switchable resistor branch during supplying energy from the energy storage system. If the first main switch and the second main switch are opened, the control unit may measure the voltage and/or the current of the first switchable resistor branch and the third switchable resistor branch, which may be alternately and periodically activated to monitor the isolation resistance between the energy storage system and the ground element. Accordingly, the control unit may be able to measure the isolation resistance of the system.

In an embodiment, the control unit is configured to monitor a voltage ratio of the second isolation resistor element and the third isolation resistor element during charging of the energy storage system. If the first main switch and the second main switch are closed, the control unit may be able to monitor the leakage current and/or voltage to the ground element and adjust a voltage between poles and chassis ground by determining the voltage ratio of the second isolation resistor element and the third isolation resistor element and comparing the voltage ratio with a known ratio of the second isolation resistor element and the third isolation resistor element. This may be applied for preventing excessive voltage between any pole to chassis ground for external power supply by comparing the voltage ratio with a known ratio of the second isolation resistor element and the third isolation resistor element and maintaining the voltage of a high voltage terminals to the ground element compatible with a limit of the external energy supply system.

In an embodiment, the control unit is configured to stop charging if the voltage ratio exceeds a predefined threshold. The voltage ratio of the second isolation resistor element and the third isolation resistor element determined during charging of the energy storage system may be compared with the predefined threshold. The predefined threshold may be the known ratio of the second isolation resistor element and the third isolation resistor element. If the voltage ratio exceeds the predefined threshold, it may be considered as a drop of the isolation resistances and/or a current leakage. Accordingly, the control unit may quickly stop charging, to avoid any hazardous situation. The control unit may be configured to stop charging less than 1 second.

In an embodiment, the ground fault monitoring system further includes a booster DC-DC unit interposed between the first main switch and the isolation monitoring unit. The booster DC-DC unit may include a booster DC-DC converter. In case the energy storage system has a higher voltage than the external energy supply system, the booster DC-DC unit may boost an input voltage from the external energy supply system to a required output, i.e. charging voltage.

The booster DC-DC converter may be a non-isolated or isolated booster DC-DC converter. The ground fault monitoring system may be particularly applied for the non-isolated booster DC-DC converter, which is conventionally used due to cost reasons. Accordingly, if the first main switch and the second main switch are closed, the booster DC-DC unit may step up the input voltage and the second switchable resistor branch and the third switchable resistor branch may be connected to the energy storage system to monitor the current leakage to the ground element.

According to the present disclosure, an energy storage system is presented. The energy storage system includes a ground fault monitoring system as described above, wherein the energy storage system is a high voltage energy storage system. The energy storage system may have a rated voltage of 800 V. Such an energy storage system may provide a higher power density than an energy storage system with a rated voltage of 400 V at the same size. Further, the energy storage system with 800 V can reduce a current carrying conductors' cross-sectional area apart from higher clearances and creepage of the power converter designs.

The energy storage system including the ground fault monitoring system may monitor an isolation resistance not only during supplying and/or discharging electric energy to subsystems connected thereto but also during charging of the energy storage system without any interference with an insolation monitoring device of an external energy supply system. Further, a very quick reaction against an isolation failure may be performed, subsequently, a quick stop of charging, for instance within 1 second may be possible.

According to the present disclosure, a vehicle is presented. The vehicle includes an energy storage system as described above, wherein the vehicle is a battery electric vehicle or a hybrid electric vehicle. In the electric vehicle, the power system may be preferably a high voltage energy storage system, e.g. providing several hundreds of volts, for providing power to an electric motor which can be used e.g. for propelling the vehicle. The high voltage energy storage system may be isolated against a ground potential, e.g. the car body to avoid any hazardous situation. The isolation resistance must be higher than a specified resistance.

The electric vehicle equipping a ground fault monitoring system according to the present disclosure may monitor an isolation resistance not only during supplying and/or discharging electric energy to subsystems connected thereto but also during charging of the energy storage system without any interference with an insolation monitoring device of an external energy supply system. Further, a very quick reaction against an isolation failure may be performed, subsequently, a quick stop of charging, for instance within 1 second may be possible.

According to the present disclosure, a method for ground fault monitoring for an energy storage system is presented. The method includes:
  arranging an isolation monitoring unit between an energy storage system=and a ground element, the isolation monitoring unit including a first switchable resistor branch, a second switchable resistor branch and a third switchable resistor branch,
  arranging a first main switch and a second main switch between the energy storage system and an external energy supply system,
  closing the first main switch and the second main switch during charging of the energy storage system for connecting the energy storage system to the external energy supply system, and
  disconnecting the first switchable resistor branch from the energy storage system and connecting the second switchable resistor branch and the third switchable resistor branch to the energy storage system for monitoring a current leakage to the ground element during charging of the energy storage system.

According to the present disclosure, a computer program element is presented. The computer program element is configured for a ground fault monitoring system as described above. The program element is adapted to perform the method steps as described above, when being executed by a processing element.

It should be noted that the above embodiments may be combined with each other irrespective of the aspect involved. Accordingly, the method may be combined with structural features and, likewise, the system may be combined with features described above with regard to the method.

These and other aspects of the present embodiments will become apparent from and elucidated with reference to the embodiments described hereinafter.

BRIEF DESCRIPTION OF THE DRAWINGS

Exemplary embodiments will be described in the following with reference to the following drawings:

FIG. 3 shows schematically and exemplarily another embodiment of a ground fault monitoring system for an energy storage system according to the present disclosure.

DESCRIPTION OF EMBODIMENTS

Figure 1:
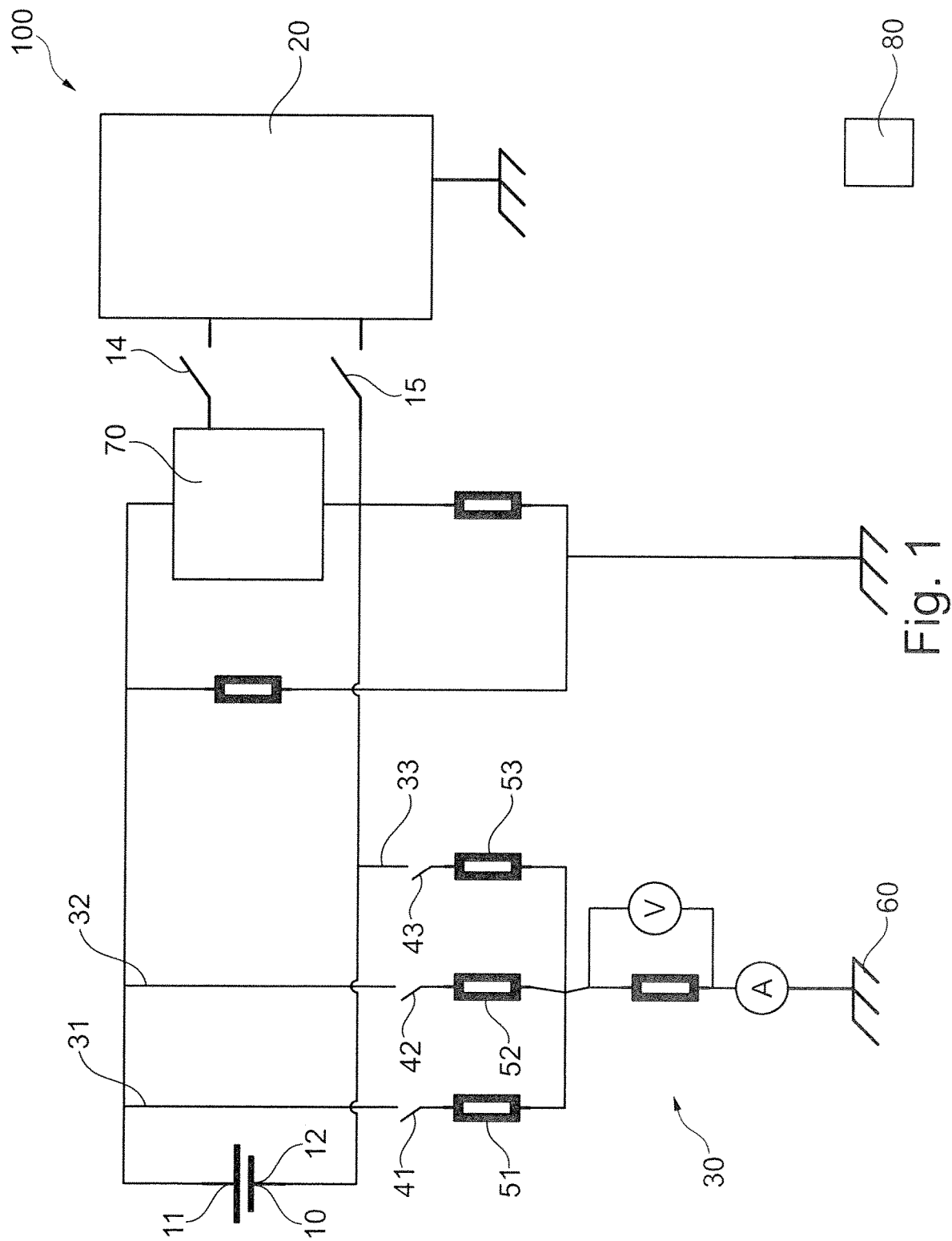
FIG. 1 shows schematically and exemplarily an embodiment of a ground fault monitoring system for an energy storage system according to the present disclosure.

FIG. 1 shows a ground fault monitoring system 100 for an energy storage system 10. The energy storage system 10 may be a high voltage energy storage system having 800 V, which may be mounted in a battery electric vehicle or a hybrid electric vehicle for propelling the vehicle. The energy storage system 10 may be charged by an external energy supply system 20, which may have a lower voltage than the energy storage system 10, i.e. 400 V. Accordingly, a supplied voltage from the external energy supply system 20 may be boosted by means of a booster DC-DC unit 70.

The ground fault monitoring system 100 includes a first main switch 14 and a second main switch 15, each of which can be connected to a positive terminal 11 and a negative terminal 12 of the external energy supply system 20. If the first main switch 14 and the second main switch 15 are closed, the energy storage system 10 may be charged by the external energy supply system 20. Whereas, if the first main switch 14 and the second main switch 15 are opened, charging the energy storage system 10 may be stopped and the energy storage system 10 may be able to operate for supplying electric energy to subsystems connected thereto.

The ground fault monitoring system 100 further includes an isolation monitoring unit 30 arranged between the energy storage system 10 and a ground element 60. Generally, the isolation monitoring unit 30 is configured to monitor an isolation resistance between the energy storage system 10 and the ground element 60 during supplying or discharging energy. The ground fault monitoring system 100 according to the present disclosure, however, also allows to monitor a current leakage during charging of the energy storage system 10 by switching the isolation monitoring unit 30.

The isolation monitoring unit 30 includes first switchable resistor branch 31, a second switchable resistor branch 32 and a third switchable resistor branch 33. The first switchable resistor branch 31 includes a first isolation switch element 41 and a first isolation resistor element 51 and encircles the first isolation switch element 41, the first isolation resistor element 51, a positive terminal 11 of the energy storage system 10 and the ground element 60 during supplying energy from the energy storage system 10.

The second switchable resistor branch 32 includes a second isolation switch element 42 and a second isolation resistor element 52 and encircles the second isolation switch element 42, the second isolation resistor element 52, the positive terminal 11 of the energy storage system 10 and the ground element 60 during charging of the energy storage system 10. The second switchable resistor branch 32 may include a bigger isolation resistance capacity than the first switchable resistor branch 31.

The third switchable resistor branch 33 includes a third isolation switch element 43 and a third isolation resistor element 53 and encircles the third isolation switch element 43, the third isolation resistor element 53, the negative terminal 12 of the energy storage system 10 and the ground element 60. The third switchable resistor branch 33 may be connected during charging of the energy storage system 10, but also during supplying energy from the energy storage system 10.

The ground fault monitoring system 100 further includes a control unit 80 may be a battery management system (BMS) or it may at least communicate with the BMS. The control unit 80 may be configured to receive information about an energy transfer state from the energy storage system 10 and control the energy transfer if necessary.

During supplying energy from the energy storage system 10, the control unit 80 is configured to open the first main switch 14, the second main switch 15 and the second isolation switch element 42. The control unit 80 is further configured to alternately open and close the first isolation switch element 41 and the third isolation switch element 43 to perform an isolation monitoring of the energy storage system 10. The control unit 80 is, hence, able to measure a voltage and/or a current in the first switchable resistor branch 31 and the third switchable resistor branch 33 during supplying energy from the energy storage system 10.

During charging of the energy storage system 10, the control unit 80 is configured to close the first main switch 14, the second main switch 15, the second isolation switch element 42 and the third isolation switch element 43 to perform a current leakage monitoring. If the voltage ratio exceeds a predefined threshold, the control unit 80 is able to quickly stop charging to avoid any hazardous situations.

Figure 2:
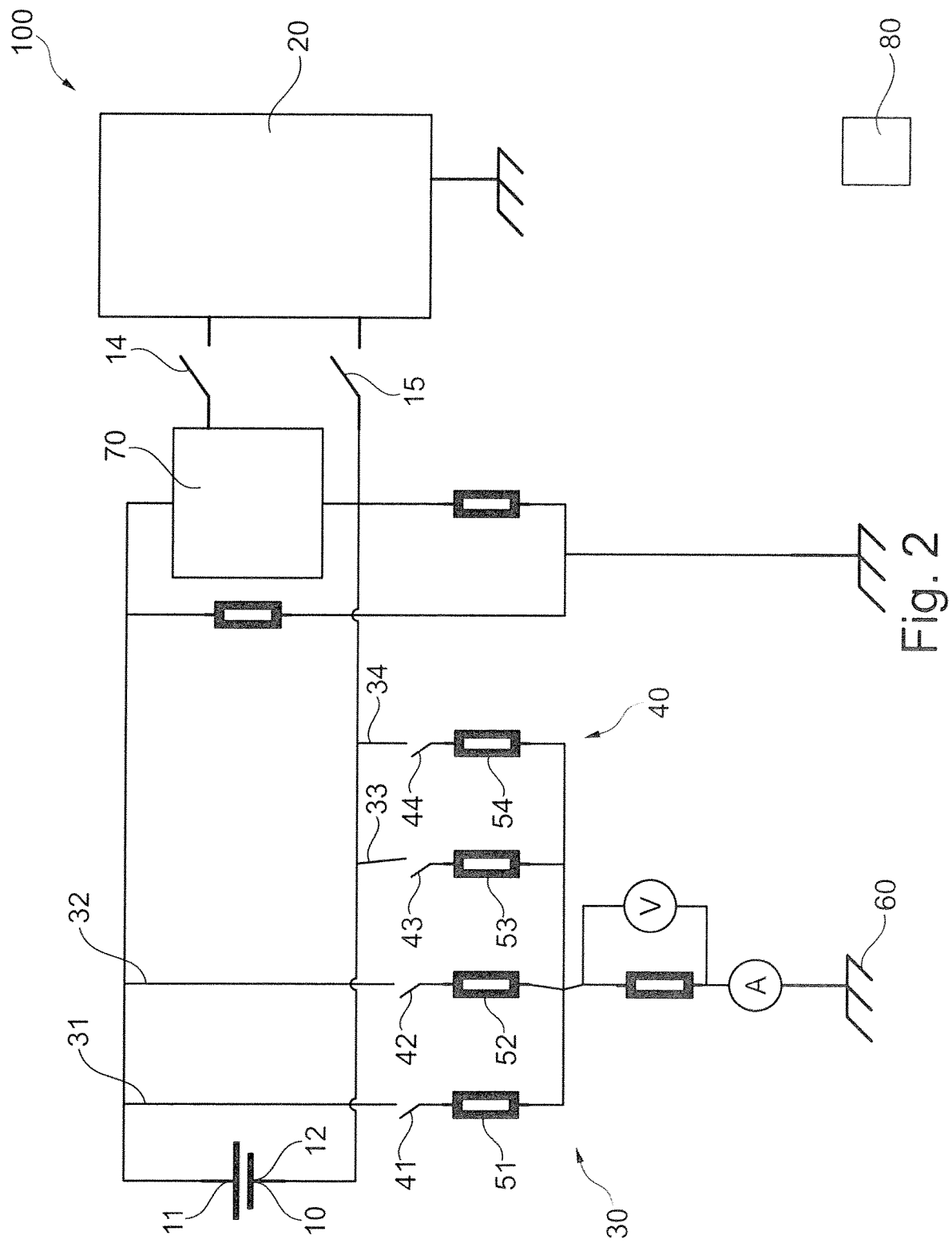
FIG. 2 shows schematically and exemplarily another embodiment of a ground fault monitoring system for an energy storage system according to the present disclosure.

In FIG. 2, the ground fault monitoring system 100 includes a symmetrization circuit 40 configured for a symmetrization of the positive terminal 11 and the negative terminal 12 of the energy storage system 10. The symmetrization circuit 40 is integrated in the isolation monitoring unit 30. The isolation monitoring unit 30 further includes a fourth switchable resistor branch 34 including a fourth isolation switch element 44 and a fourth isolation resistor element 54. The fourth switchable resistor branch 34 may encircle the fourth isolation switch element 44, the fourth isolation resistor element 54, the negative terminal 12 of the energy storage system 10 and the ground element 60.

During discharging energy from the energy storage system 10, i.e. if the first main switch 14 and the second main switch 15 are opened, the first isolation switch element 41 and the third isolation switch element 43 may be alternately closed to perform the isolation monitoring. Meanwhile, the second isolation switch element 42 and the fourth isolation switch element 44 may be opened.

During charging of the energy storage system 10, the second isolation switch element 42 and the fourth isolation switch element 44 may be continuously closed to realize an ideal symmetrical system. Meanwhile, the first isolation switch element 41 and the third isolation switch element 43 may be controlled to form the symmetrization circuit 40.

The control unit 80 continuously monitors the current and/or the voltage of the isolation monitoring unit 30 and/or the ground fault monitoring system 100. In case the control unit 80 is not able to control the asymmetry due to an isolation failure and/or a leakage current, the control unit 80 stops charging the energy storage system 10 by opening the first main switch 14 and the second main switch 15.

FIG. 3 shows the ground fault monitoring system 100 with the ground element 60 including a first ground member 61 and a second ground member 62. The first switchable resistor branch 31 and/or the second switchable resistor branch 32, which may be connected to the positive terminal 11 of the energy storage system 10, are coupled with the first ground member 61 and the third switchable resistor branch 33 and/or the fourth switchable resistor branch, which may be connected to the negative terminal 12 of the energy storage system 10, are coupled with the second ground member 62. Accordingly, a separate isolation monitoring of a pole to chassis voltage for the positive pole and the negative pole may performed. Further, in this embodiment, the control unit 80 is further configured to monitor a voltage ratio of the second isolation resistor element 52 and the third isolation resistor element 53 during charging of the energy storage system 10 for determining a current leakage.

It has to be noted that embodiments of the disclosure are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfill the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A ground fault monitoring system for an energy storage system, the ground fault monitoring system comprising:
   an isolation monitoring unit;
   a first main switch;
   a second main switch; and
   a control unit;
   the isolation monitoring unit being arrangeable between the energy storage system and a ground element;
   the first main switch and the second main switch being arrangeable between the energy storage system and an external energy supply system;

the isolation monitoring unit comprising a first switchable resistor branch, a second switchable resistor branch and a third switchable resistor branch;

the control unit being configured to close the first main switch and the second main switch during charging of the energy storage system for connecting the energy storage system to the external energy supply system; and the control unit being further configured to disconnect the first switchable resistor branch from the energy storage system and connect the second switchable resistor branch and the third switchable resistor branch to the energy storage system for monitoring a current leakage to the ground element during charging of the energy storage system.

2. The ground fault monitoring system according to claim 1, during supplying energy from the energy storage system, the control unit being configured to open the first main switch and the second main switch and to alternately connect and disconnect the first switchable resistor branch and the third switchable resistor branch.

3. The ground fault monitoring system according to claim 1, the first switchable resistor branch comprising a first isolation switch element and a first isolation resistor element and encircling the first isolation switch element, the first isolation resistor element, a positive terminal of the energy storage system and the ground element during supplying energy from the energy storage system.

4. The ground fault monitoring system according to claim 1, the second switchable resistor branch comprising a second isolation switch element and a second isolation resistor element and encircling the second isolation switch element, the second isolation resistor element, the positive terminal of the energy storage system and the ground element during charging of the energy storage system.

5. The ground fault monitoring system according to claim 1, the third switchable resistor branch comprising a third isolation switch element and a third isolation resistor element and encircling the third isolation switch element, the third isolation resistor element, a negative terminal of the energy storage system and the ground element.

6. The ground fault monitoring system according to claim 1, further comprising a symmetrization circuit configured for a symmetrization of the positive terminal and the negative terminal of the energy storage system, the symmetrization circuit being integrated in the isolation monitoring unit and/or the isolation monitoring unit further comprising a fourth switchable resistor branch.

7. The ground fault monitoring system according to claim 6, the ground element comprising a first ground member and a second ground member, the first switchable resistor branch and the second switchable resistor branch being connected to the first ground member and the third switchable resistor branch and the fourth switchable resistor branch being connected to the second ground member.

8. The ground fault monitoring system according to claim 1, the control unit being configured to measure a voltage and/or a current in the first switchable resistor branch and the third switchable resistor branch during supplying energy from the energy storage system.

9. The ground fault monitoring system according to claim 1, the control unit being configured to monitor a voltage ratio of the second isolation resistor element and the third isolation resistor element during charging of the energy storage system.

10. The ground fault monitoring system according to claim 9, the control unit being configured to stop charging if the voltage ratio exceeds a predefined threshold.

11. The ground fault monitoring system according to claim 1, further comprising a booster DC-DC unit, the booster DC-DC unit being interposed between the first main switch and the isolation monitoring unit.

12. An energy storage system comprising the ground fault monitoring system according to claim 1, the energy storage system being a high voltage energy storage system.

13. A vehicle comprising the energy storage system according to claim 12, the vehicle being a battery electric vehicle or a hybrid electric vehicle.

14. A method for ground fault monitoring for an energy storage system, the method comprising:

arranging an isolation monitoring unit between an energy storage system and a ground element, the isolation monitoring unit comprising a first switchable resistor branch, a second switchable resistor branch and a third switchable resistor branch;

arranging a first main switch and a second main switch between the energy storage system and an external energy supply system;

closing the first main switch and the second main switch during charging of the energy storage system for connecting the energy storage system to the external energy supply system; and disconnecting the first switchable resistor branch from the energy storage system and connecting the second switchable resistor branch and the third switchable resistor branch to the energy storage system for monitoring a current leakage to the ground element during charging of the energy storage system.

15. A computer program element for a ground fault monitoring system, when executed by a processing element, being adapted to perform the method steps of the method of claim 14.

* * * * *